United States Patent
Dube et al.

(10) Patent No.: US 9,929,055 B2
(45) Date of Patent: *Mar. 27, 2018

(54) METHOD TO GROW THIN EPITAXIAL FILMS AT LOW TEMPERATURE

(71) Applicant: Applied Materials, Inc., Santa Clara, CA (US)

(72) Inventors: Abhishek Dube, Fremont, CA (US); Hua Chung, San Jose, CA (US); Jenn-Yue Wang, Fremont, CA (US); Xuebin Li, Sunnyvale, CA (US); Yi-Chiau Huang, Fremont, CA (US); Schubert S. Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/391,623

(22) Filed: Dec. 27, 2016

(65) Prior Publication Data

US 2017/0178962 A1   Jun. 22, 2017

Related U.S. Application Data

(63) Continuation of application No. 14/870,792, filed on Sep. 30, 2015, now Pat. No. 9,530,638.

(Continued)

(51) Int. Cl.
*H01L 21/20* (2006.01)
*H01L 21/8234* (2006.01)
(Continued)

(52) U.S. Cl.
CPC .. *H01L 21/823431* (2013.01); *H01L 21/0243* (2013.01); *H01L 21/0245* (2013.01);
(Continued)

(58) Field of Classification Search
CPC ......... H01L 21/02664; H01L 21/02639; H01L 21/02532; H01L 21/0243; H01L 21/0245;
(Continued)

(56) References Cited

U.S. PATENT DOCUMENTS

| | | | |
|---|---|---|---|
| 2011/0210404 A1 | 9/2011 | Su et al. | |
| 2013/0193446 A1* | 8/2013 | Chao | H01L 29/66795 257/77 |

(Continued)

FOREIGN PATENT DOCUMENTS

JP   2013197307   9/2013

*Primary Examiner* — Brook Kebede
(74) *Attorney, Agent, or Firm* — Patterson + Sheridan LLP

(57) ABSTRACT

Implementations of the present disclosure generally relate to methods for epitaxial growth of a silicon material on an epitaxial film. In one implementation, the method includes forming an epitaxial film over a semiconductor fin, wherein the epitaxial film includes a top surface having a first facet and a second facet, and forming an epitaxial layer on at least the top surface of the epitaxial film by alternatingly exposing the top surface to a first precursor gas comprising one or more silanes and a second precursor gas comprising one or more chlorinated silanes at a temperature of about 375° C. to about 450° C. and a chamber pressure of about 5 Torr to about 20 Torr.

20 Claims, 3 Drawing Sheets

Related U.S. Application Data

(60) Provisional application No. 62/072,937, filed on Oct. 30, 2014.

(51) Int. Cl.
*H01L 21/02* (2006.01)
*H01L 29/78* (2006.01)
*H01L 21/3065* (2006.01)

(52) U.S. Cl.
CPC .... *H01L 21/0262* (2013.01); *H01L 21/02381* (2013.01); *H01L 21/02513* (2013.01); *H01L 21/02516* (2013.01); *H01L 21/02532* (2013.01); *H01L 21/3065* (2013.01); *H01L 29/7848* (2013.01); *H01L 29/7851* (2013.01)

(58) Field of Classification Search
CPC .......... H01L 21/20516; H01L 21/0262; H01L 29/41791; H01L 29/66795; H01L 29/785
USPC ................. 438/478, 481; 257/384, 390, 401
See application file for complete search history.

(56) References Cited

U.S. PATENT DOCUMENTS

| | | |
|---|---|---|
| 2014/0084369 A1 | 3/2014 | Murthy et al. |
| 2014/0120678 A1 | 5/2014 | Shinriki et al. |
| 2015/0170916 A1* | 6/2015 | Yu .................... H01L 21/02664 438/493 |

* cited by examiner

METHOD TO GROW THIN EPITAXIAL FILMS AT LOW TEMPERATURE

CROSS-REFERENCE TO RELATED APPLICATIONS

This application is a continuation of application Ser. No. 14/870,792, filed on Sep. 30, 2015, which claims benefit of U.S. provisional patent application Ser. No. 62/072,937, filed Oct. 30, 2014, which in herein incorporated by reference.

BACKGROUND

Field

Implementations of the disclosure generally relate to the field of semiconductor manufacturing processes and devices, more particularly, to methods for epitaxial growth of a silicon material on an epitaxial film.

Description of the Related Art

As circuit densities increase for next generation devices, the widths of interconnects, such as vias, trenches, contacts, gate structures and other features, as well as the dielectric materials therebetween, decrease to 22 nm or smaller dimensions, whereas the thickness of the dielectric layers remain substantially constant, with the result of increasing the aspect ratios of the features. Recently, complementary metal oxide semiconductor (CMOS) FinFET devices have been widely used in many logic and other applications and are integrated into various different types of semiconductor devices.

FinFET devices typically include semiconductor fins with high aspect ratios in which the channel and source/drain regions for the transistor are formed thereover. A gate electrode is then formed over and along side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

To improve transistor performance, stressor materials may fill source/drain areas, and the stressor materials may grow in source/drain areas by epitaxy. The epitaxial film is faceted by {111} planes and has a diamond shape along the transistor channel direction. With the scaling down of transistors, there is always a need for improved methods for forming FinFETs.

SUMMARY

Implementations of the present disclosure generally relate to methods for epitaxial growth of a silicon material on an epitaxial film. In one implementation, the method includes forming an epitaxial film over a semiconductor fin formed on the substrate, wherein the epitaxial film includes a top surface having a first facet and a second facet, and forming an epitaxial layer on at least the top surface of the epitaxial film by alternatingly exposing the top surface to a first precursor gas comprising one or more silanes and a second precursor gas comprising one or more chlorinated silanes at a temperature of about 375° C. to about 450° C. and a chamber pressure of about 5 Torr to about 20 Torr.

In another implementation, the method includes loading a semiconductor structure into a processing chamber, wherein the semiconductor structure comprises a substrate, a plurality of semiconductor fins formed on the substrate, and a dielectric material disposed between the semiconductor fins on the substrate, forming an epitaxial film over the plurality of semiconductor fins, wherein each epitaxial film includes a top surface having a first facet and a second facet, and forming a silicon layer on the top surface of the epitaxial film by alternatingly exposing the top surface to a first precursor gas comprising one or more silanes and a second precursor gas comprising one or more chlorinated silanes at a temperature less than about 450° C. and a chamber pressure of about 5 Torr to about 20 Torr.

In yet another implementation, the method includes (a) forming an epitaxial film over a semiconductor fin formed on the substrate, wherein each epitaxial film includes a top surface having a first facet and a second facet, (b) exposing the epitaxial film to a first precursor gas comprising silane ($SiH_4$) or disilane ($Si_2H_6$) at a temperature less than about 450° C. and a chamber pressure of about 5 Torr to about 20 Torr, (c) after (b), pulsing the first precursor gas for a first period of time, (d) after (c), introducing a purge gas into the processing chamber, (e) after (d), exposing the epitaxial film to a second precursor gas comprising one or more chlorinated silanes at a temperature less than about 450° C. and a chamber pressure of about 5 Torr to about 20 Torr, (f) after (e), pulsing the first precursor gas for a second period of time, and (g) after (f), introducing the purge gas into the processing chamber. In various examples, the method further comprises repeating (b) to (g) for about 10 cycles or 300 cycles until a desired thickness of a silicon layer is grown on the top surface of the epitaxial film.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
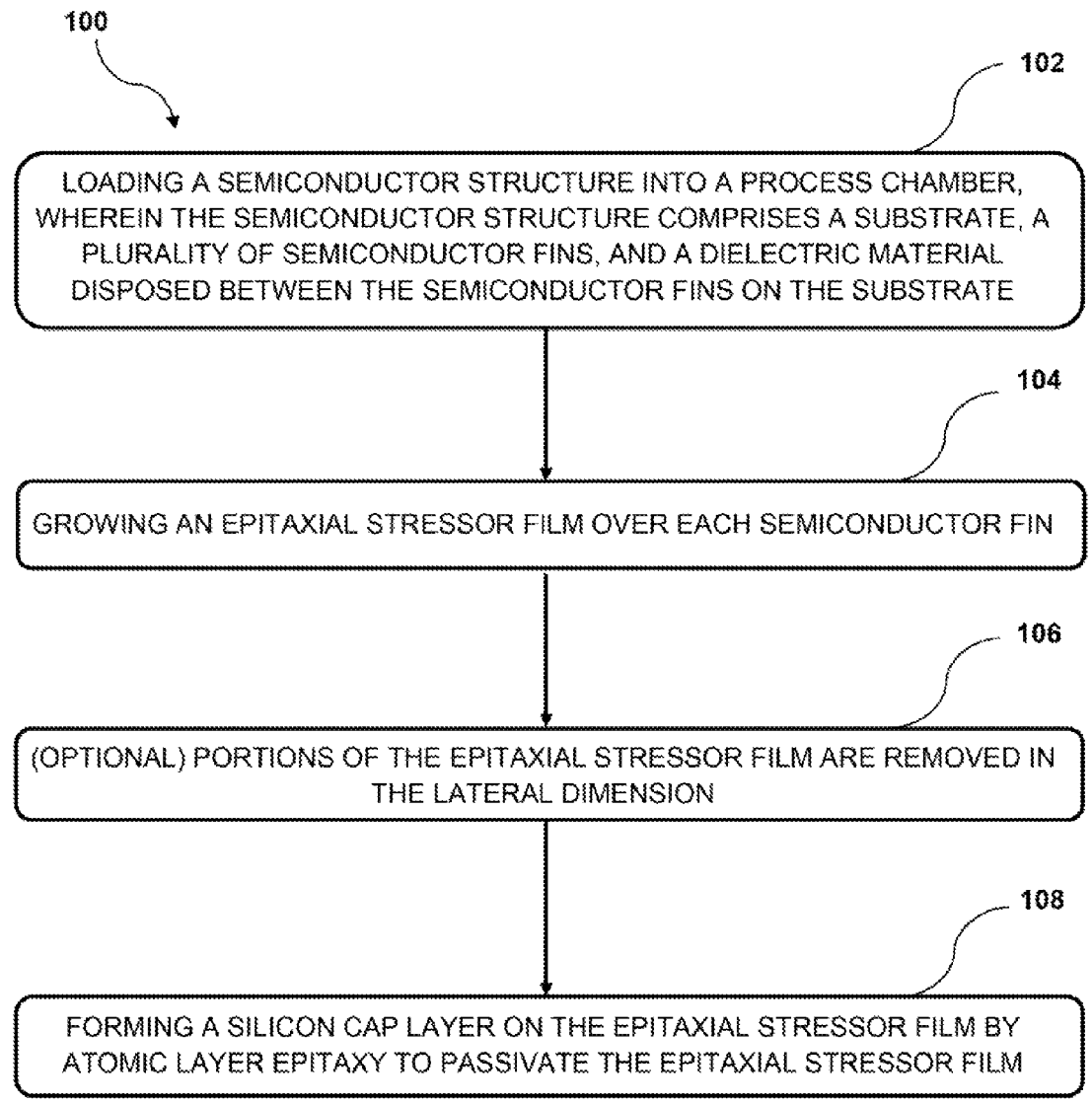
FIG. 1 is a flow chart illustrating an exemplary method for manufacturing semiconductor structure according to implementations of the disclosure.

To facilitate understanding, identical reference numerals have been used, where possible, to designate identical elements that are common to the figures. It is contemplated that elements disclosed in one implementation may be beneficially utilized in other implementations without specific recitation.

DETAILED DESCRIPTION

Figure 2A:
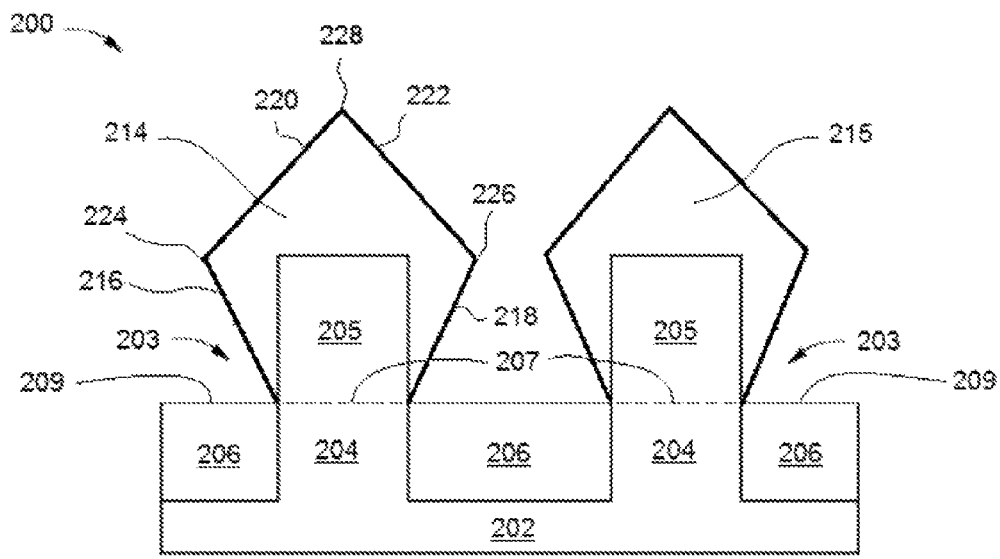
FIGS. 2A to 2C illustrate cross-sectional views of a simplified semiconductor structure during certain stages of fabrication according to the flow chart of FIG. 1.
Figure 2B:
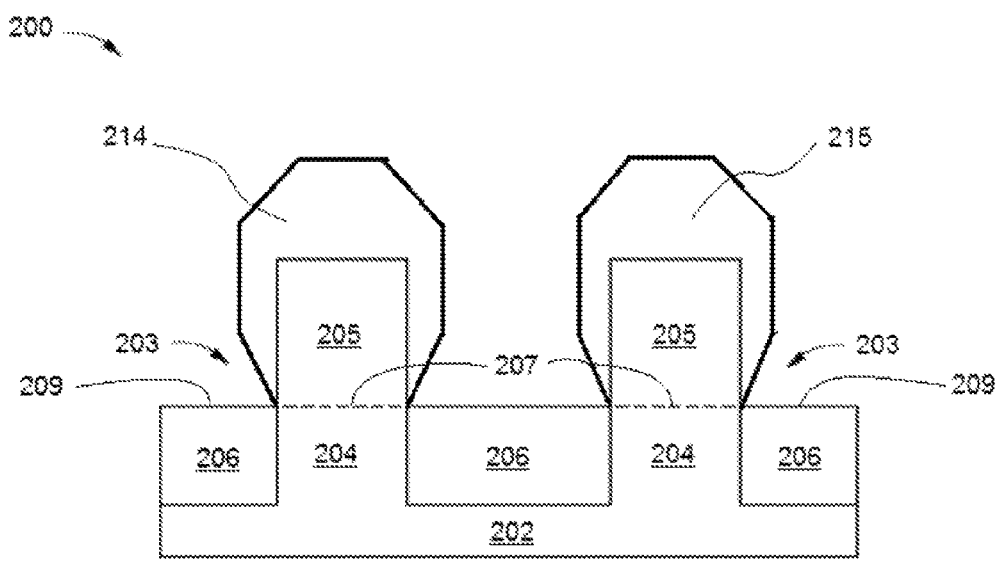
Figure 2C:
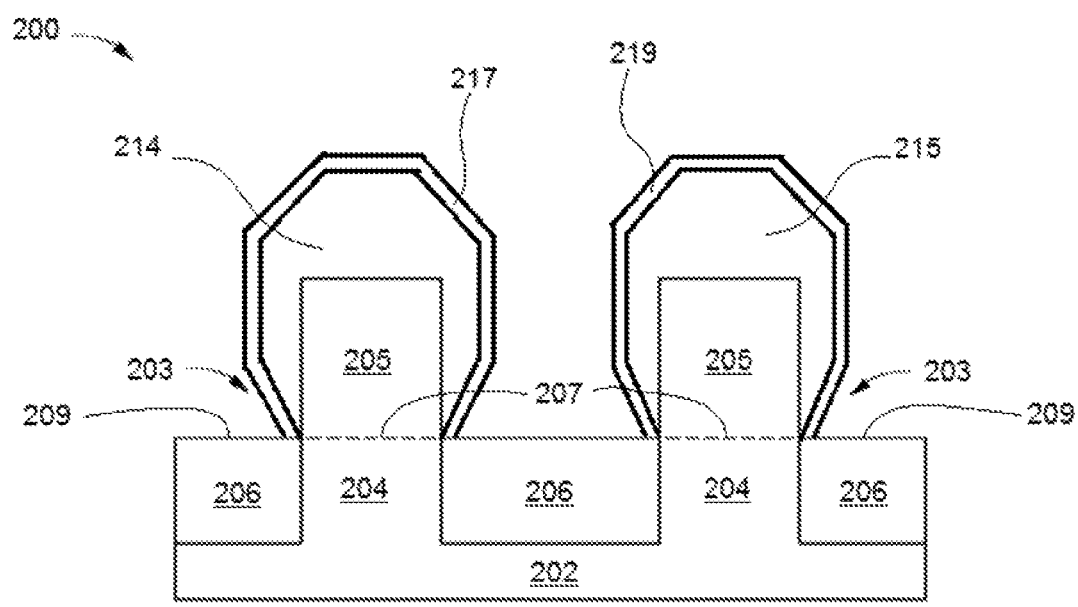

FIG. 1 is a flow chart illustrating an exemplary method for manufacturing semiconductor structure according to implementations of the disclosure. FIGS. 2A to 2C illustrate cross-sectional views of a simplified semiconductor structure during certain stages of fabrication according to the flow chart of FIG. 1. Those skilled in the art will further recognize that the full process for forming a semiconductor device and the associated structures are not illustrated in the drawings or described herein. Instead, for simplicity and clarity, only so much of a process for forming a semiconductor device and the associated structures as is unique to the present disclosure or necessary for an understanding of the present disclosure is depicted and described. In addition, although various steps are illustrated in the drawings and described herein, no limitation regarding the order of such steps or the presence or absence of intervening steps is implied. Steps depicted or described as sequential are, unless explicitly specified, merely done so for purposes of explanation without precluding the possibility that the respective steps are actually performed in concurrent or overlapping manner, at least partially if not entirely.

The method 100 begins at block 102 by loading a semiconductor structure 200 into a process chamber. The semiconductor structure 200 comprises a substrate 202, a plurality of semiconductor fins 203 (only two are shown), and a dielectric material 206 disposed between the semiconductor fins 203 on the substrate 202, as shown in FIG. 2A. The process chamber may be any suitable deposition process chamber known in the art of ALE (atomic layer epitaxy) or ALD (atomic layer deposition), CVD (chemical vapor deposition), or plasma assisted process.

The term "substrate" used herein is intended to broadly cover any object that can be processed in a process chamber. For example, the substrate 202 may be any substrate capable of having material deposited thereon, such as a silicon substrate, for example silicon (doped or undoped), crystalline silicon (e.g., Si <100> or Si <111>), silicon oxide, strained silicon, doped or undoped polysilicon, or the like, germanium, a III-V compound substrate, a silicon germanium (SiGe) substrate, a silicon germanium carbide (SiGeC) substrate, a silicon germanium oxide (SiGeO) substrate, a silicon germanium oxynitride (SiGeON) substrate, a silicon carbide (SiC) substrate, a silicon carbonitride (SiCN) substrate, a silicon carbonoxide (SiCO), an epi substrate, a silicon-on-insulator (SOI) substrate, a carbon doped oxide, a silicon nitride, a display substrate such as a liquid crystal display (LCD), a plasma display, an electro luminescence (EL) lamp display, a solar array, solar panel, a light emitting diode (LED) substrate, a patterned or non-patterned semiconductor wafer, glass, sapphire, or any other materials such as metals, metal alloys, and other conductive materials. The substrate 202 may be a planar substrate or a patterned substrate. Patterned substrates are substrates that include electronic features formed into or onto a processing surface of the substrate. The substrate 202 may include multiple layers, or include, for example, partially fabricated devices such as transistors, flash memory devices, and the like.

In one implementation, the substrate 202 is a monocrystalline silicon, such as a P doped silicon. The semiconductor fins 203 may include the same or different material as the substrate 202. In the implementation as shown, the semiconductor fins 203 and the substrate 202 are formed of the same material. The dielectric material 206 may form isolation regions, such as shallow trench isolation (STI) regions, and may include SiO, SiN, SiCN, or any suitable dielectric material.

The semiconductor fins 203 may be employed in forming channels for FinFET transistor in later stages. Each semiconductor fin 203 may include a first portion 204 which has a surface 207 that is coplanar with a surface 209 of the dielectric material 206, and a second portion 205 that protrudes upwardly from the first portion 204. The second portion 205 may be functioned as a source or drain region. Therefore, a top surface of the semiconductor structure 200 includes one or more semiconductor regions, i.e., the first portion 204 and/or the second portion 205 of the semiconductor fins 203, and one or more dielectric regions, i.e., the dielectric material 206.

At block 104, an epitaxial stressor film 214, 215 is grown over each semiconductor fin 203 on the second portion 205 (i.e., source/drain region) to improve transistor performance. The epitaxial stressor film 214, 215 may be part of a source or drain region. The epitaxial stressor film 214, 215 may enclose or cover the exposed surfaces of the second portion 205 of the semiconductor fin 203, as shown in FIG. 2A. Alternatively, the second portion 205 of the semiconductor fin 203 may be removed and the epitaxial stressor film 214, 215 may be formed on the first portion 204 of the semiconductor fin 203.

The epitaxial stressor film 214, 215 may include Si:P, SiGe, SiGe:B, Si:CP, or other suitable semiconductor material. In one implementation, the epitaxial stressor film 214, 215 includes SiGe material. In some applications where high concentration of germanium is required, for example pMOS source and drain materials used in conductive nodes advancing 7 nm and beyond, the concentration of germanium in the silicon may be above about 30%, for example about 45% or more, such as about 70% to about 100%.

The epitaxial stressor film 214, 215 may be formed using a selective deposition process, such that the epitaxial stressor film 214, 215 is grown on the semiconductor fins 203 and not on the dielectric material 206. The resulting epitaxial stressor film 214 may have a monocrystalline structure. The selective deposition process may be achieved by co-flowing an etchant along with the precursor gases into the deposition chamber. Examples of the etchant may be HCl, Cl$_2$, or any suitable halogen gas. Precursor gases may include any suitable silicon containing gas, such as silane, disilane, an organosilane, or a halosilane, and any suitable germanium containing gas such as germane.

The epitaxial stressor film 214, 215 may be grown epitaxially on the semiconductor fin 203, and because of the different growth rate on different surface planes, facets may be formed to cause the epitaxial stressor film 214, 215 to have a diamond shape when it is observed along the transistor channel direction (the channel extends along a top and opposite sidewalls of the semiconductor fin 203). The epitaxial stressor film 214, 215 is faceted by {111} planes, pinned at top corner and sidewall corners. For example, the epitaxial stressor film 214 may include a plurality of facets 216, 218, 220, 222 (for clarity, only one semiconductor fin 203 is labeled in FIG. 2A). Facets 216, 218 may be in contact with the semiconductor fin 203. Facet 216 and facet 220 may be in contact with each other, and a corner 224 may be formed at the contacting point. Facet 218 and facet 222 may be in contact with each other, and a corner 226 may be formed at the contacting point. Facet 220 and facet 222 may be in contact with each other, and a corner 228 may be formed at the contacting point.

At block 106, portions of the epitaxial stressor film 214, 215 are optionally removed in the lateral dimension. Specifically, portions on opposing sides of the epitaxial stressor film 214 are removed to increase the distance between the epitaxial stressor film 214 on a semiconductor fin and an epitaxial stressor film 215 grown on an adjacent semiconductor fin. A portion of the corner 228 at the contacting point may optionally be removed, as shown in FIG. 2B. With scaling down of transistors, fin pitch (distance between two adjacent fins) is getting smaller. Thus, the epitaxial stressor film grown on the source/drain can be touched or merged. Once merging happens, the effect of stressor (on strain on the transistor channel) is decreased and defects are easily formed at the junction of merged area, which negatively affects the performance of the semiconductor structure and therefore the transistor performance. Due to the increased distance between adjacent epitaxial films, the epitaxial stressor film 214 and an adjacent stressor film 215 are prevented from touching or merging to each other. This optional removal of the portions of the epitaxial stressor films may be achieved by etching, polishing or other suitable removal process. The etch process may be performed in the same chamber for deposition, or in a separate but integrated chamber.

At block 108, a silicon cap layer 217, 219 is conformally formed on the epitaxial stressor film 214, 215, respectively, to passivate the epitaxial stressor film 214, 215 so that the subsequent layers, for example a gate dielectric (such as silicon dioxides, carbon doped silicon oxides, silicon germanium oxides, or high-k dielectric materials), can be easily formed over a portion of the semiconductor fin 203. The silicon cap layer may form on at least the top surface (i.e., facets 220, 222) of the stressor film 214, 215. The silicon cap layer 217, 219 may be grown by chemical vapor deposition (CVD) processes, atomic layer epitaxy (ALE) or atomic layer deposition (ALD) processes. In one implementation, the silicon cap layer 217, 219 is formed by an ALE process. The ALE process is a cyclical deposition process that employs chemisorption techniques to deliver precursor molecules on a heated substrate surface in sequential cycles. In various implementations, the epitaxial stressor films 214, 215 are sequentially exposed to a first precursor gas, a purge gas, a second precursor gas, and a purge gas. The first and second precursor gases react to form a chemical compound as a film on the surface of epitaxial stressor films 214, 215. This cycle is repeated to grow the silicon cap layer 217, 219 in a layer-by-layer fashion until a desired thickness is reached. In one implementation where the underlying SiGe epitaxial stressor film 214, 215 is about 3-6 nm in thickness, the silicon cap layer 217, 219 may have a thickness of about 1 nm to about 5 nm, for example about 2 nm to about 3 nm. Deposition of the silicon cap layer may be performed in the same chamber for deposition of the epitaxial stressor film 214, 215, or in a separate but integrated chamber.

In various implementations, the first precursor gas and the second precursor gas may be silicon-containing gases. Suitable silicon-containing gases may include one or more of silanes, halogenated silanes or organosilanes. Silanes may include silane ($SiH_4$) and higher silanes with the empirical formula $Si_xH_{(2x+2)}$, such as disilane ($Si_2H_6$), trisilane ($Si_3H_8$), or tetrasilane ($Si_4H_{10}$). Halogenated silanes may include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes may include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Suitable germanium-containing gases may include, but are not limited to germane ($GeH_4$), digermane ($Ge_2H_6$), trigermane ($Ge_3H_8$), or a combination of two or more thereof. In some implementations, tetraethylorthosilicate (TEOS) may also be used as the first or second precursor gas.

In one exemplary implementation, the first precursor gas is a silicon-based precursor gas such as silane ($SiH_4$) or higher silanes with the empirical formula $Si_xH_{(2x+2)}$, such as disilane ($Si_2H_6$), trisilane ($Si_3H_8$), or tetrasilane ($Si_4H_{10}$). If desired, the first precursor gas may include one or more of the silicon-based precursor gases described herein. The second precursor gas is a halogenated silane, for example a chlorinated silane, such as monochlorosilane ($SiH_3Cl$, MCS), dichlorosilane ($Si_2H_2Cl_2$, DCS), trichlorosilane (SiHCl$_3$, TCS), hexachlorodisilane ($Si_2Cl_6$, HCDS), octachlorotrisilane ($Si_3Cl_8$, OCTS), or silicon tetrachloride (STC). If desired, the second precursor gas may include one or more of the halogenated silanes described herein. Suitable purge gas may include helium, argon, nitrogen, hydrogen, forming gas, or combinations thereof.

In one exemplary example using ALE process, the first precursor gas is disilane and the second precursor gas is HCDS. The ALE process is performed at a temperature range of about 350° C. to about 550° C., such as about 375° C. to about 450° C., for example about 425° C., and a chamber pressure of about 1 Torr to about 40 Torr, such as about 5 Torr to about 20 Torr, for example about 10 Torr. In cases where the underlying epitaxial stressor film 214, 215 has high concentration of Ge (e.g., 30% or above, such as 40% or above) in silicon, it may be advantageous to use lower deposition temperatures (e.g., about 425° C. or lower, such as 350° C. to about 375° C.) to avoid deformation of the epitaxial stressor film.

In operation, the epitaxial stressor films 214, 215 are exposed to the first precursor gas using disilane. The first precursor gas is introduced into the process chamber at a flow rate in a range from about 5 sccm to about 35 sccm, such as about 10 sccm to about 25 sccm, for example about 20 sccm. The first precursor gas is then pulsed for about 5 seconds to about 25 seconds, for example about 15 seconds. Next, a purge gas is introduced into the process chamber at a flow rate in a range from about 5 sccm to about 25 sccm, such as about 10 sccm to about 20 sccm, for example about 15 sccm. Next, epitaxial stressor films 214, 215 are exposed to the second precursor gas using HCDS. The second precursor gas is introduced into the process chamber at a flow rate in a range from about 250 sccm to about 550 sccm, such as about 350 sccm to about 450 sccm, for example about 400 sccm. The second precursor gas is diluted in either nitrogen or hydrogen carrier gas flowing into the process chamber at a flow rate of about 1 SLM to about 30 SLM, for example about 3 SLM. The second precursor gas is then pulsed for about 5 seconds to about 25 seconds, for example about 15 seconds. Thereafter, the purge gas is introduced into the process chamber at a flow rate in a range from about 5 sccm to about 25 sccm, such as about 10 sccm to about 20 sccm, for example about 15 sccm. A silicon cap layer is conformally and uniformly grown on the epitaxial stressor film by alternating disilane and HCDS at the above-described process conditions. Dosing with hexachlorodisilane ($Si_2Cl_6$, HCDS) exchanges the —H ligand for Cl termination at the surface and forms an additional silicon layer thereon. This process may be repeated about 300 cycles at a growth rate of about 0.1 Å/cycle to reach a desired thickness.

In another exemplary example using ALE process, the first precursor gas is still disilane and the second precursor gas is still HCDS. However, a longer pulse time is adapted. In this example, the ALE process is performed at a temperature range of about 350° C. to about 550° C., such as about 375° C. to about 450° C., for example about 425° C., and a chamber pressure of about 1 Torr to about 40 Torr, such as about 5 Torr to about 20 Torr, for example about 10 Torr. In cases where the underlying epitaxial stressor film 214, 215 has high concentration of Ge (e.g., 30% or above, such as 40% or above) in silicon, it may be advantageous to use lower deposition temperatures (e.g., about 425° C. or lower, such as 350° C. to about 375° C.) to avoid deformation of the epitaxial stressor film.

In operation, the epitaxial stressor films 214, 215 are exposed to the first precursor gas using disilane. The first precursor gas is introduced into the process chamber at a flow rate in a range from about 5 sccm to about 35 sccm, such as about 10 sccm to about 25 sccm, for example about 20 sccm. The first precursor gas is then pulsed for about 350 seconds to about 550 seconds, for example about 450 seconds. Next, a purge gas is introduced into the process chamber at a flow rate in a range from about 5 sccm to about 25 sccm, such as about 10 sccm to about 20 sccm, for example about 15 sccm. Next, epitaxial stressor films 214, 215 are exposed to the second precursor gas using HCDS. The second precursor gas is introduced into the process chamber at a flow rate in a range from about 250 sccm to about 550 sccm, such as about 350 sccm to about 450 sccm, for example about 400 sccm. The second precursor gas is diluted in either nitrogen or hydrogen carrier gas flowing into the process chamber at a flow rate of about 1 SLM to about 30 SLM, for example about 3 SLM. The second precursor gas is then pulsed for about 350 seconds to about 550 seconds, for example about 450 seconds. Thereafter, the purge gas is introduced into the process chamber at a flow rate in a range from about 5 sccm to about 25 sccm, such as about 10 sccm to about 20 sccm, for example about 15 sccm. A monolayer of silicon is conformally and uniformly grown on the epitaxial stressor film by alternating disilane and HCDS at the above-described process conditions. This process may be repeated about 10 cycles at a growth rate of about 0.1 Å/cycle to reach a desired thickness.

In yet another exemplary example using ALE process, the first precursor gas is silane and the second precursor gas is HCDS. Silane has been observed to be advantageous in some applications since it shows less lateral film growth on the sidewall of the semiconductor fin 203. In this example, the ALE process is performed at a temperature range of about 350° C. to about 550° C., such as about 375° C. to about 450° C., for example about 425° C., and a chamber pressure of about 1 Torr to about 40 Torr, such as about 5 Torr to about 20 Torr, for example about 10 Torr. In cases where the underlying epitaxial stressor film 214, 215 has high concentration of Ge (e.g., 30% or above, such as 40% or above) in silicon, it may be advantageous to use lower deposition temperatures (e.g., about 425° C. or lower, such as 350° C. to about 375° C.) to avoid deformation of the epitaxial stressor film.

In operation, the epitaxial stressor films 214, 215 are exposed to the first precursor gas using silane. The first precursor gas is introduced into the process chamber at a flow rate in a range from about 25 sccm to about 55 sccm, such as about 30 sccm to about 45 sccm, for example about 40 sccm. The first precursor gas is then pulsed for about 650 seconds to about 1200 seconds, for example about 900 seconds. Next, a purge gas is introduced into the process chamber at a flow rate in a range from about 5 sccm to about 25 sccm, such as about 10 sccm to about 20 sccm, for example about 15 sccm. Next, epitaxial stressor films 214, 215 are exposed to the second precursor gas using HCDS. The second precursor gas is introduced into the process chamber at a flow rate in a range from about 250 sccm to about 550 sccm, such as about 350 sccm to about 450 sccm, for example about 400 sccm. The second precursor gas is diluted in either nitrogen or hydrogen carrier gas flowing into the process chamber at a flow rate of about 1 SLM to about 30 SLM, for example about 3 SLM. The second precursor gas is then pulsed for about 350 seconds to about 550 seconds, for example about 450 seconds. Thereafter, the purge gas is introduced into the process chamber at a flow rate in a range from about 5 sccm to about 25 sccm, such as about 10 sccm to about 20 sccm, for example about 15 sccm.

A monolayer of silicon is conformally grown and uniformly grown on the epitaxial stressor film by alternating silane and HCDS at the above-described process conditions. This process may be repeated about 10 cycles at a growth rate of about 0.1 Å/cycle to reach a desired thickness.

After the silicon cap layers 217, 219 with a desired thickness have been grown on the epitaxial stressor films 214, 215, a gate dielectric layer (not shown) may be formed over the silicon cap layer 217, 219. A gate electrode is then formed over and alongside of a portion of the semiconductor fins 203 to form a general structure of the FinFET.

The concept described in implementations of the present disclosure is also applicable to other epitaxial materials. Some examples may include Si:CP, pure Ge, GeSn, GeP, GeB, or GeSnB, etc., which may be used in logic and memory applications. In such cases, possible silicon precursors may comprise halogenated silicon compounds and optionally silicon-containing compounds as those described above, and possible germanium precursors may comprise halogenated germanium compounds and optionally germanium-containing compounds as those described above. For example, if a silicon germanium is to be used as the cap layer, epitaxial growth of silicon germanium may be achieved by alternatingly exposing the epitaxial stressor film to a first precursor gas comprising one or more of the silicon-containing gases described in this disclosure and a second precursor gas comprising one or more of halogenated germanium gases such as chlorinated germane gas, germanium-containing gas or silicon-containing gas. Purge gas and any desired dopant gas may be introduced into the process chamber in a fashion as discussed above with respect to the silicon cap layer. In one exemplary implementation, the first precursor gas may be silane or disilane and the second precursor gas may be chlorinated germane gas such as germanium tetrachloride ($GeCl_4$), dichlorogermane ($GeH_2Cl_2$), or germane ($GeH_4$).

Benefits of the present disclosure include direct growth of a thin silicon cap layer on a SiGe epitaxial stressor layer by atomic layer epitaxy (ALE) process using a first precursor gas comprising silanes and a second precursor gas comprising chlorinated silanes. It has been observed that growth of silicon cap layer on epitaxial stressor film comprising SiGe by alternating silane or disilane and HCDS can be achieved at lower growth temperatures. Particularly, since the silicon cap layer is grown by ALE process using a self-limiting layer-by-layer fashion, the silicon cap layer can be grown uniformly and conformally on epitaxial stressor film without losing selectivity of growth to dielectrics, such as such as silicon oxides and silicon nitrides. The epitaxial growth of silicon using silanes and chlorinated silanes to passivate stressor films allows for better growth of subsequent gate dielectrics, resulting in superior integration and surface morphology of the epitaxial material for FinFETs.

While the foregoing is directed to implementations of the present disclosure, other and further implementations of the disclosure may be devised without departing from the basic scope thereof, and the scope thereof is determined by the claims that follow.

We claim:
1. A method of processing a substrate in a processing chamber, comprising:
  forming an epitaxial film over a semiconductor fin formed on the substrate, wherein the epitaxial film comprises a top surface having a first facet and a second facet, the first facet having an exposed {111} plane and the second facet having an exposed {111} plane; and forming a conformal passivation layer on at least the top surface of the epitaxial film by alternatingly exposing the top surface to a first precursor gas comprising one or more silanes and a second precursor gas comprising one or more halogenated silanes at a temperature of about 425° C. or less and a chamber pressure of about 5 Torr to about 20 Torr.

2. The method of claim 1, wherein the first precursor gas comprises silane ($SiH_4$), disilane ($Si_2H_6$), trisilane ($Si_3H_8$), tetrasilane ($Si_4H_{10}$), or tetraethylorthosilicate (TEOS), or any combination thereof.

3. The method of claim 2, wherein the second precursor gas comprises monochlorosilane ($SiH_3Cl$), dichlorosilane ($Si_2H_2Cl_2$), trichlorosilane ($SiHCl_3$), hexachlorodisilane ($Si_2Cl_6$), octachlorotrisilane ($Si_3Cl_8$), or silicon tetrachloride (STC), or any combination thereof.

4. The method of claim 3, wherein the first precursor gas is disilane and the second precursor gas is hexachlorodisilane ($Si_2Cl_6$).

5. The method of claim 3, wherein first precursor gas is silane ($SiH_4$) and the second precursor gas is hexachlorodisilane ($Si_2Cl_6$).

6. The method of claim 1, wherein the epitaxial film is silicon germanium (SiGe) having Ge concentration of about 30% or above in silicon.

7. The method of claim 1, further comprising:
introducing a purge gas into the processing chamber between flowing of the first precursor gas and flowing of the second precursor gas.

8. The method of claim 7, wherein the purge gas comprises helium, argon, nitrogen, hydrogen, or forming gas, or any combination thereof.

9. The method of claim 7, further comprising:
pulsing flowing of the first precursor gas for about 5 seconds to about 25 seconds prior to flowing of the purge gas.

10. The method of claim 7, further comprising:
pulsing flowing of the first precursor gas for about 350 seconds to about 550 seconds prior to flowing of the purge gas.

11. The method of claim 1, wherein one end of the first facet and one end of the second facet are in contact with each other.

12. The method of claim 11, further comprising:
before forming a conformal passivation layer on at least the top surface of the epitaxial film, removing a portion of the first facet and a portion of the second facet in a lateral dimension.

13. The method of claim 1, wherein the epitaxial film and the conformal passivation layer are formed in the same processing chamber.

14. The method of claim 1, further comprising:
after forming a conformal passivation layer on at least the top surface of the epitaxial film, forming a gate electrode over a portion of the conformal passivation layer.

15. The method of claim 1, wherein the epitaxial film is pure germanium (Ge).

16. The method of claim 1, wherein the epitaxial film is phosphorus doped silicon carbide (SiC:P).

17. The method of claim 1, wherein the epitaxial film is phosphorus doped silicon (Si:P).

18. The method of claim 1, wherein the epitaxial film is boron doped silicon germanium (SiGe:B).

19. A method of processing a substrate in a processing chamber, comprising:
forming an epitaxial film over a semiconductor fin formed on the substrate, wherein the epitaxial film comprises a top surface having a first facet and a second facet, the first facet having exposed {111} plane and the second facet having exposed {111} plane;
exposing the epitaxial film to a first precursor gas comprising silane ($SiH_4$) or disilane ($Si_2H_6$) at a temperature of about 425° C. or less;
pulsing the first precursor gas for a first period of time;
introducing a purge gas into the processing chamber;
exposing the epitaxial film to a second precursor gas comprising chlorinated silanes at a temperature less than about 425° C. or less;
pulsing the second precursor gas for a second period of time; and
introducing the purge gas into the processing chamber.

20. The method of claim 19, wherein the first period of time is about 5 seconds to about 25 seconds or about 350 seconds to about 550 seconds, and the second period of time is about 5 seconds to about 25 seconds or about 350 seconds to about 550 seconds.

* * * * *